United States Patent
Chang et al.

(10) Patent No.: US 7,349,196 B2
(45) Date of Patent: Mar. 25, 2008

(54) COMPOSITE DISTRIBUTED DIELECTRIC STRUCTURE

(75) Inventors: Chih-Hao Chang, Kaohsiung (TW); Shih-Hsien Wu, Yangmei Township, Taoyuan County (TW); Min-Lin Lee, Hsinchu (TW); Shinn-Juh Lay, Jhudong Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 278 days.

(21) Appl. No.: 11/156,350

(22) Filed: Jun. 17, 2005

(65) Prior Publication Data

US 2006/0285273 A1 Dec. 21, 2006

(51) Int. Cl.
*H01G 4/06* (2006.01)

(52) U.S. Cl. .............. 361/321.4; 361/321.1; 361/321.2; 361/321.5; 361/311; 361/313

(58) Field of Classification Search ......... 361/321.1, 361/321.2, 321.5, 311–313, 306.1, 306.2, 361/306.3, 302–305, 321.4
See application file for complete search history.

(56) References Cited

U.S. PATENT DOCUMENTS

| | | | |
|---|---|---|---|
| 4,759,965 A | 7/1988 | Kato et al. .......... 10/4 |
| 5,055,966 A * | 10/1991 | Smith et al. .......... 361/321.3 |
| 5,604,017 A | 2/1997 | Frankosky .......... 428/209 |
| 5,753,968 A | 5/1998 | Bahl et al. .......... 257/664 |
| 6,015,739 A * | 1/2000 | Gardner et al. .......... 438/287 |
| 6,068,884 A * | 5/2000 | Rose et al. .......... 438/762 |
| 6,406,945 B1* | 6/2002 | Lee et al. .......... 438/142 |
| 6,627,821 B2 | 9/2003 | Kim et al. .......... 174/255 |
| 6,819,540 B2* | 11/2004 | Allen et al. .......... 361/302 |
| 6,998,636 B2* | 2/2006 | Venkatraman et al. .......... 257/40 |
| 7,211,881 B2* | 5/2007 | McKinnell et al. .......... 257/678 |
| 2006/0097246 A1* | 5/2006 | Palanduz et al. .......... 257/40 |

FOREIGN PATENT DOCUMENTS

WO WO2004/079797 9/2004

* cited by examiner

*Primary Examiner*—Nguyen T. Ha

(57) ABSTRACT

A composite distributed dielectric structure includes one or more conductor layers, one or more dielectric layers distributed on the conductor layers, and one or more conductor traces distributed on the dielectric layers. One or more dielectric plates can be further formed around the conductor traces. The dielectric layers or plates may or may not have plural dielectric materials therein. Each conductor trace lies on a dielectric material without crossing two different dielectric materials. Two or more dielectric layers may be stacked on the conductor layers.

23 Claims, 11 Drawing Sheets

COMPOSITE DISTRIBUTED DIELECTRIC STRUCTURE

FIELD OF THE INVENTION

The present invention generally relates to dielectric structures used for interconnects systems, and more specifically to a composite distributed dielectric structure. It is applicable to interconnects systems at high-speed circuits.

BACKGROUND OF THE INVENTION

The growing trend of more functionality and smaller form factor for electronic components has resulted in a dramatic increase of electrical interconnect density in integrated circuits (intra-chip interconnect), electronic packages and circuit boards (inter-chip interconnect). Dielectric layers in electronic circuits are employed as capacitors or circuit boards/substrates. High dielectric constant materials normally have better heat dissipative capability than the low dielectric constant materials, and therefore make them ideal for power components at high frequencies, such as microwave frequencies. A high dielectric constant material also leads to a large interconnect capacitance, which has pros and cons. In order to reduce simultaneous switching noise (SSN), high dielectric constant substrates are required for power and ground planes. However, signal lines surrounded by high dielectric constant materials can cause an increase of cross-talk, dielectric loss, and propagation delay at high frequency transmission. The dielectric loss is a result of the hysterical loop which is worse for high dielectric constant material than for low constant dielectric material. The propagation delay is due to the fact that the wavelength of a signal becomes shorter when it propagates through a material with a higher dielectric constant Transmission lines, including microstrip lines and strip lines, are important elements in microwave circuits. These lines not only provide interconnection between active and passive devices but also are utilized as an impedance matching element for the circuits. A microstrip line is a conductor trace routed as the top or bottom layer for example of a circuit board. A strip line is a conductor trace routed on the inside layer for example of a circuit board. The impedance of a transmission line is proportional to dielectric constants of surrounding materials and trace height, and inversely proportional to trace width and trace thickness. As the effective dielectric constant of a strip line is higher than that of a microstrip line, less dielectric loss can be achieved in a microstrip line than in a strip line. In order to better control the impedance matching of transmission lines in microwave circuits, low dielectric constant materials are therefore desired.

In general, low dielectric constant materials are adopted for high speed and low loss transmission of signals but their poor heat dissipative capability may result in excessive heat and temperature. If a whole circuit is built on either a low or a high dielectric constant material, the circuit will then suffer heat dissipation and impedance matching problems or dielectric loss and propagation delay problems. In order to take advantage of their different material properties, both high and low dielectric constants materials must be chosen in different areas of a circuit board/substrate to meet specific requirements.

Several techniques based on the layout of microstrip or strip line on the dielectric material have been developed to reduce the dissipation loss in microwave circuit applications. In U.S. Pat. No. 5,753,968, Bahl et al disclosed an off-chip interconnect scheme, wherein an add-on layer 101 of dielectric material between a strip conductor 103 and a substrate 102 is used to reduce the dissipation loss in monolithic microwave integrated circuits as shown in FIG. 1. The dielectric constant of the add-on layer 101 is less than that of the substrate 102. The add-on dielectric layer 101 is disposed on top of the substrate 102 and placed at a different level (non-coplanar) from the substrate 102. It is often formed by bonding a layer of low dielectric material onto the high dielectric substrate 102 using a conventional lamination method, and then followed by photolithographic and etching processes to define the circuit pattern. The yield is usually low. In this case, a whole layer of material is consumed just to meet one specific requirement. Therefore, the cost is high. Furthermore, the surface topology is rough and not good for subsequent manufacturing processes.

In U.S. Pat. No. 5,604,017, Frankosky proposed a multi-dielectric laminate taking the advantage of both high and low dielectric material properties for off-chip interconnect layout of high frequency transmission circuits. The multi-dielectric laminate comprises a common conductor overlying materials having different dielectric constants laminated onto one continuous ground plane. By employing the continuous conductor and ground plane, it eliminates the need for constant impedance devices or conductor jumpers, and the top surface of the conductor may be printed and etched as a continuous piece, with allowances for the constant impedance lines across each dielectric.

According to International Patent Publication WO 2004/079797, a high speed interconnect system was proposed for both on-chip and off-chip interconnects to reduce the microwave loss and the signal propagation delay. For on-chip interconnects, the signal lines 201 laid on the oxide or dielectric material 202 connect the high-speed electronics devices (not shown) on a semiconductor substrate 204. For off-chip interconnects in a PCB, opened trenches or slots 203 are used to reduce the microwave loss of high-speed chips, as shown in FIG. 2. The trenches or slots may be filled with air or low dielectric material. The trench or slot does not go all the way through the dielectric layer. The manufacturing process is difficult and the depth of trench or slot is hard to precisely control.

SUMMARY OF THE INVENTION

The present invention has been made to overcome the aforementioned drawback of conventional dielectric structures used for interconnects systems. The primary object of the present invention is to provide a composite distributed dielectric structure for interconnects systems.

In a first preferred embodiment of the present invention, a composite distributed dielectric structure comprises one or more conductor layers, one or more dielectric layers formed on the conductor layers, and one or more conductor traces formed on the dielectric layers. At least one dielectric layer has plural dielectric materials therein.

In a second preferred embodiment of the present invention, the composite distributed dielectric structure further comprises one or more dielectric plates formed around the conductor traces. Wherein the dielectric layers or plates may or may not have plural dielectric materials therein.

According to the invention, the dielectric layer or dielectric plate having plural dielectric materials therein has at least two dielectric constants. Each conductor trace does not cross two different dielectric materials. In other words, each conductor trace lies on a dielectric material. The conductor traces on different dielectric layers are electrically connected through via holes. Two or more dielectric layers may be stacked on one conductor layer.

An adhesive layer may be further attached between a conductor trace and a dielectric layer, or between a dielectric layer and a conductor layer. The composite distributed dielectric structure may be realized with a flexible laminate, a printed circuit board, or a substrate.

In a first example of the first embodiment, the composite distributed dielectric structure comprises a conductor layer, a dielectric layer having plural dielectric materials, and a conductor trace overlying the dielectric layer. The dielectric layer is formed on the conductor layer. The dielectric layer has plural dielectric materials with different dielectric constants.

In a second example of the first embodiment, the composite distributed dielectric structure comprises a conductor trace, two dielectric layers having plural dielectric materials in each layer, and first and second conductor layers. The two dielectric layers are stacked between the two conductor layers. Each dielectric material in each dielectric layer may have a dielectric constant and a dielectric loss. The conductor trace is formed between the two stacked dielectric layers and lies on a dielectric material.

In a third example of the first embodiment, the composite distributed dielectric structure is formed by bonding together one composite distributed dielectric structure of the first example on top of at least one composite distributed dielectric structure of the second example. These composite distributed dielectric structures can be electrically connected through via holes. The strip conductor lines of each composite distributed dielectric structure are normally routed perpendicularly to those of adjacent composite distributed dielectric structures.

In a fourth example of the first embodiment, the composite distributed dielectric structure is formed by bonding together plural composite distributed dielectric structures of second examples. These composite distributed dielectric structures can be electrically connected through via holes. The strip conductor lines of each composite distributed dielectric structure are normally routed perpendicularly to those of adjacent composite distributed dielectric structures.

In an example of the second embodiment, the composite distributed dielectric structure comprises two conductor layers, two dielectric layers, a conductor trace formed on the dielectric layer, and a dielectric plate formed around the conductor trace. The dielectric layer has plural dielectric materials therein.

The fundamental structures provided in this invention can be used for high-speed connectors, high-speed cables, and intra-chip and inter-chip interconnects systems at high speed transmission. The present invention provides a low cost and practical dielectric structure for interconnect system to reduce dielectric loss, cross talk, and signal propagation delay and to well control the impedance matching while maintaining proper heat dissipation and noise reduction at high frequency transmission.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
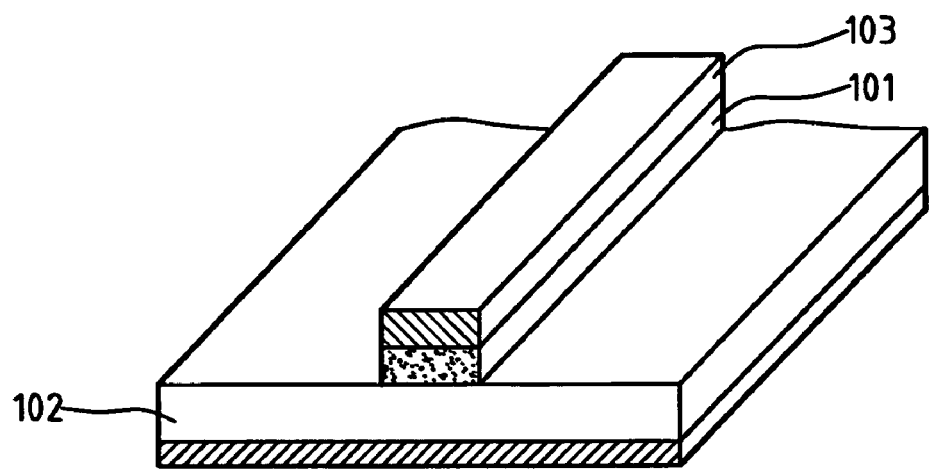
FIG. 1 is a diagram of a conventional microstrip line on a substrate having different dielectric constants materials.
Figure 2:
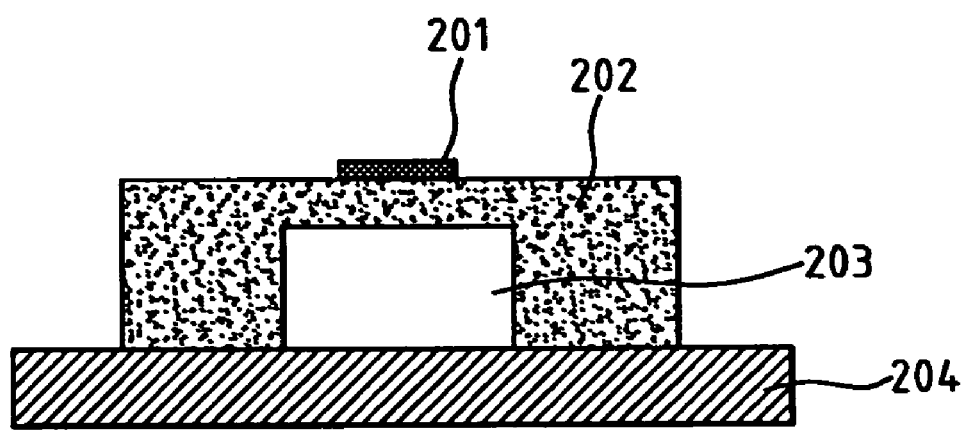
FIG. 2 is a side view of a conventional interconnects system.
Figure 3A:
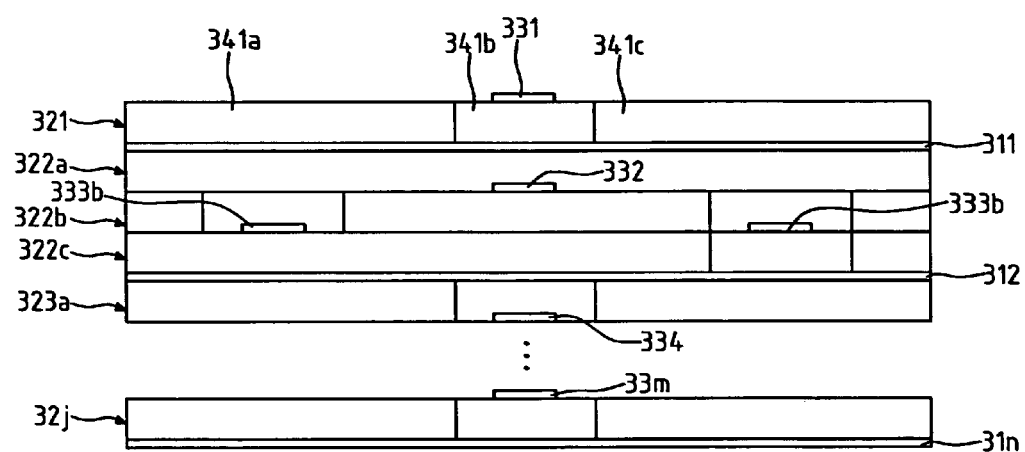
FIG. 3A is a diagram of the composite distributed dielectric structure in a first preferred embodiment according to the present invention.

In the invention, a composite distributed dielectric structure having different dielectric constants is provided to meet specific requirements in high frequency electronic circuits. Both high- and low-dielectric constants materials are chosen in different areas of a circuit board or substrate to meet specific applications. FIG. 3A is a diagram of the composite distributed dielectric structure in a first preferred embodiment according to the present invention.

The composite distributed dielectric structure of FIG. 3A comprises one or more conductor layers, one or more dielectric layers distributed on the conductor layers, and one or more conductor traces distributed on the dielectric layers. At least one dielectric layer has plural dielectric materials therein.

Referring to FIG. 3A, the composite distributed dielectric structure 300 comprises conductor layers 311-31$n$, dielectric layers 321, 322$a$-322$c$, 323$a$, . . . , 32$j$ formed on the conductor layers 311-31$n$, and conductor traces 331, 332, 333$a$-333$b$, 334, 33$m$ formed on the dielectric layers 321, 322$a$-322$c$, 32$j$.

Dielectric layer 321 is formed on the conductor layer 311, and the dielectric layer 321 has dielectric materials 341$a$-341$c$ therein. Conductor trace 331 is formed on the dielectric layer 321.

Dielectric layers 322$a$-322$c$ are stacked and formed on the conductor layer 312. Conductor trace 332 is formed on the dielectric layer 322$b$, and conductor traces 333$a$-333$b$ are formed on the dielectric layer 322$c$. Dielectric layer 322$a$ has one dielectric material therein. Dielectric layer 322$b$ has five dielectric materials therein. Dielectric layer 322$c$ has three dielectric materials therein. Dielectric layer 323a has three dielectric materials therein.

Conductor trace 33m is formed on the bottom dielectric layer 32j. Dielectric layer 32j has three dielectric materials therein, and is formed on the bottom conductor layer 31n.

According to the invention, the dielectric layer having plural dielectric materials therein has at least two dielectric constants. These different dielectric materials may include high/low dielectric constant materials, FR4, and so on. The conductor traces lying on the different dielectric layers may be electrically connected through via holes. The conductor layer may be a metal layer. The composite distributed dielectric structure may be realized with a flexible laminate, a printed circuit board, or a substrate and the like.

As can be seen from FIG. 3A, a plurality of stacked dielectric layers may be formed between two conductor layers. Each conductor trace lies on a dielectric material without crossing two different dielectric materials.

The manufacturing process for realizing the composite distributed dielectric structure of FIG. 3A is described as follows. The dielectric layer is disposed onto the conductor layer (e.g., aluminum or copper foil) to from a substrate (e.g., FR4). This can be done with a conventional lamination method. Then, at least one trench/slot is opened in the dielectric layer. Either a photolithographic process followed by a chemical etching process or a laser etching process can be adopted for the trench/slot opening. The trenches/slots are then filled up with different dielectric constant materials to meet specific applications. The filling process may be a printing or deposition process. Finally, the conductor layer is formed and defined on top of the dielectric layer. The formation of the conductor layer can be achieved with an electro-plating or lamination technique. The definition of the circuit pattern is usually performed with a photolithographic process and then followed by a chemical etching process.

Figure 3B:
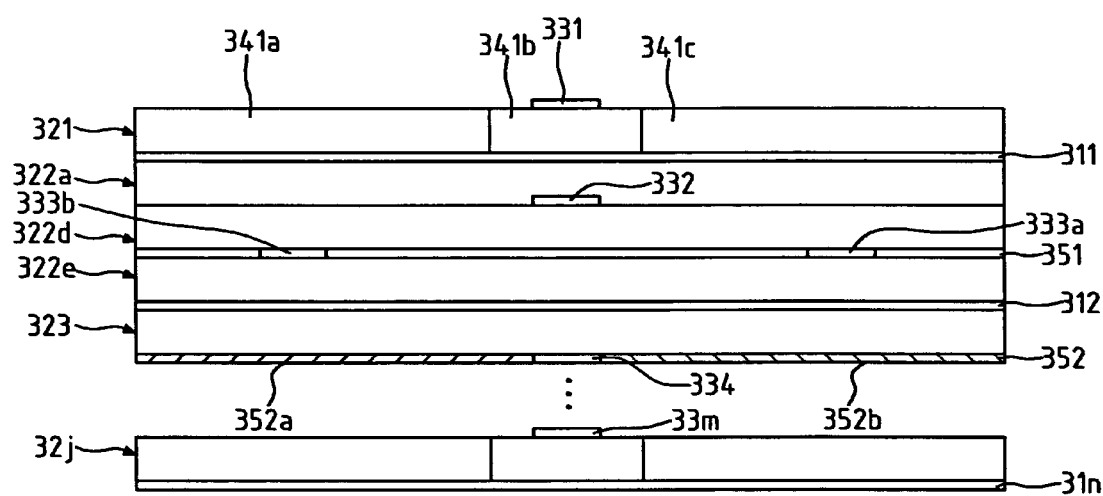
FIG. 3B is a diagram of the composite distributed dielectric structure in a second preferred embodiment according to the present invention.

FIG. 3B is a diagram of the composite distributed dielectric structure in a second preferred embodiment according to the present invention. The difference between the first and second embodiments is that one or more dielectric plates are further formed around the conductor traces in the second embodiment. Wherein the dielectric layers or plates may or may not have plural dielectric materials therein. Without loss of generality, two dielectric plates 351 and 352 are shown in the second embodiment. The dielectric plate 351 is formed around the conductor traces 333a and 33b. The dielectric plate 352 is formed around the conductor traces 334.

In the second preferred embodiment shown in FIG. 3B, each of the dielectric layers 322a, 322d, 322e and 323 has one dielectric material therein. This can be a special example of the second embodiment. According to the present invention, the dielectric layers may have plural dielectric materials therein, such as dielectric layers 321 and 32j. The dielectric layer having plural dielectric materials therein has at least two dielectric constants. This has been illustrated in the first embodiment Further referring to FIG. 3B, the dielectric plate 351 has one dielectric material therein. This can also be a special example of the second embodiment. According to the present invention, the dielectric plates may have plural dielectric materials therein, such as the dielectric plate 352. The dielectric plate 352 has two dielectric materials 352a and 352b therein, and the two dielectric materials 352a and 352b have different dielectric constants.

The preferred embodiments of the present invention will become better understood from the following examples with a detailed description provided herein below.

The following four examples are taken from the first preferred embodiment shown in FIG. 3A.

Figure 4A:
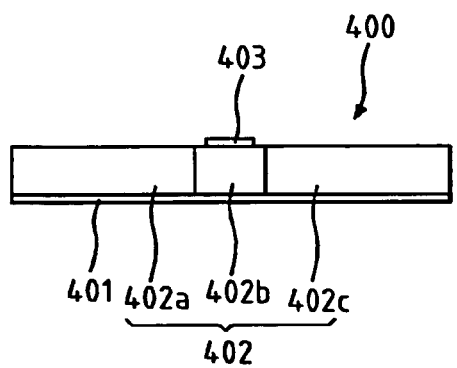
FIG. 4A is a side view of a first example of FIG. 3A according to the present invention.
Figure 4B:
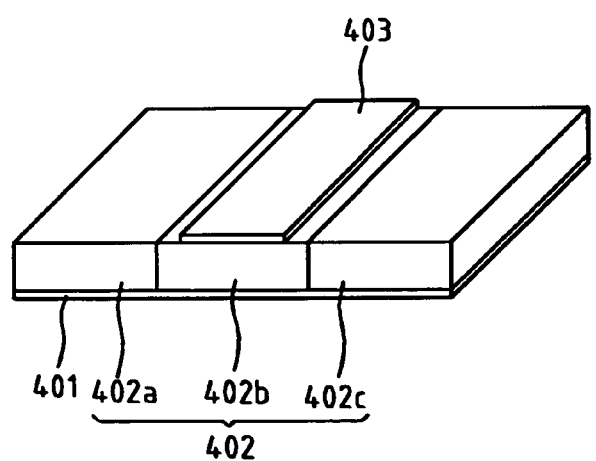
FIG. 4B is a perspective view of the first example of FIG. 3A according to the present invention.

FIG. 4A is a side view of a first example of FIG. 3A according to the present invention. Referring to FIG. 4A, the composite distributed dielectric structure 400 comprises a conductor layer 401, a dielectric layer 402 having plural dielectric materials 402a-402c therein, and a conductor trace 403 formed on the dielectric layer 402 and without crossing two different dielectric materials. The dielectric layer 402 is formed on the conductor layer 401. FIG. 4B is a perspective view of the first example of FIG. 3A according to the present invention.

Figure 5A:
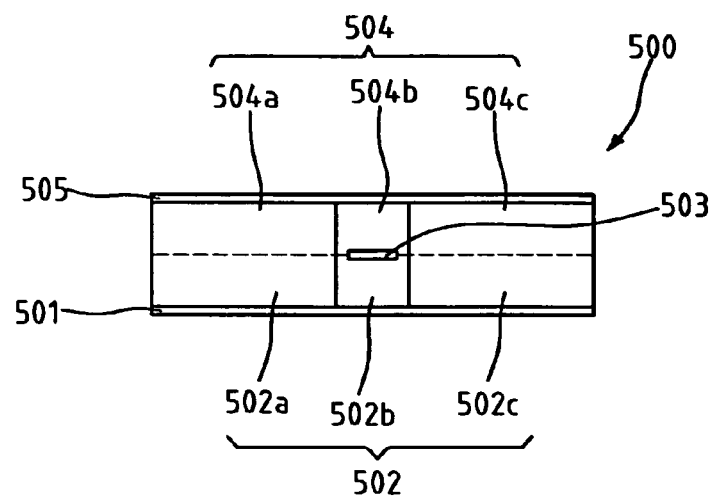
FIG. 5A is a side view of a second example of FIG. 3A according to the present invention.
Figure 5B:
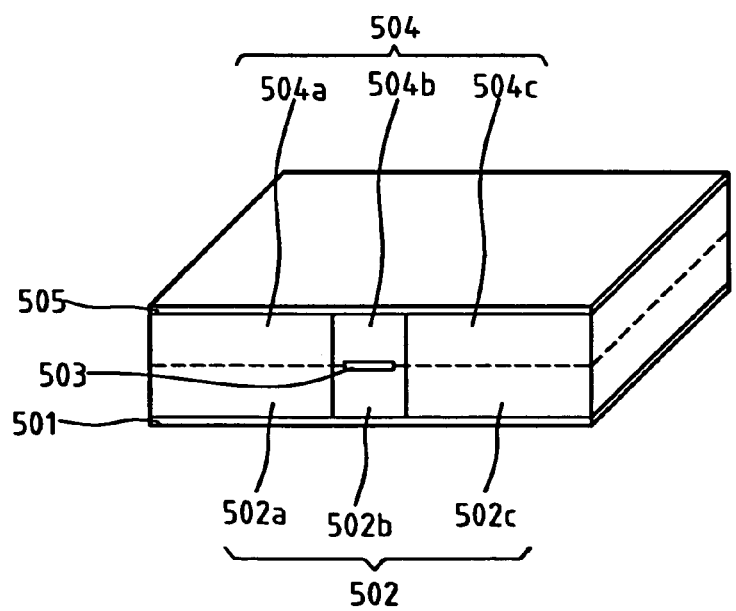
FIG. 5B is a perspective view of the second example of FIG. 3A according to the present invention.

FIG. 5A is a side view of a second example of FIG. 3A according to the present invention. Referring to FIG. 5A, the composite distributed dielectric structure 500 comprises a first conductor layer 501, a second conductor layer 505, two dielectric layers 502 and 504 formed between the two conductor layers 501 and 505 and having plural dielectric materials in each layer, and a conductor trace 503 lying between the two dielectric layers 502 and 504. Different dielectric materials 502a-502c in the dielectric layer 502 may have different dielectric constants. Different dielectric materials 504a-504c in the dielectric layer 504 may have different dielectric constants. FIG. 5B is a perspective view of the second example of FIG. 3A according to the present invention.

Figure 6:
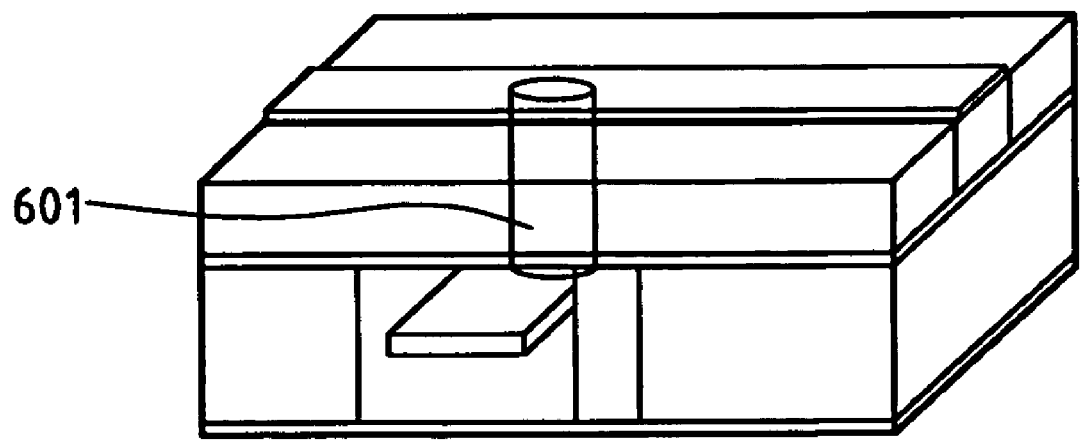
FIG. 6 is a perspective view of a third example of FIG. 3A according to the present invention.

FIG. 6 is a perspective view of a third example of FIG. 3A according to the present invention. Wherein the composite distributed dielectric structure is formed by bonding together one composite distributed dielectric structure of the first example on top of one or more composite distributed dielectric structures of the second example. These composite distributed dielectric structures can be electrically connected, such as through via holes 601.

Figure 7:
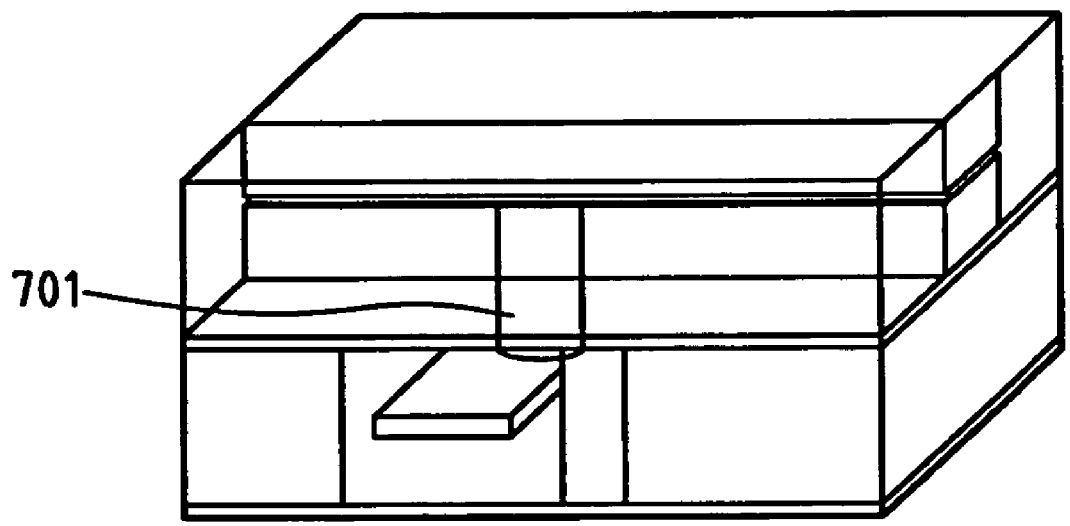
FIG. 7 is a perspective view of a fourth example of FIG. 3A according to the present invention.

FIG. 7 is a perspective view of a fourth example of FIG. 3A according to the present invention. Wherein the composite distributed dielectric structure is formed by bonding together plural composite distributed dielectric structures of the second example. Without loss of generality, two composite distributed dielectric structures of the second example are taken in the fourth example of FIG. 3A. These composite distributed dielectric structures can be electrically connected, such as through via holes 701.

The strip conductor lines of each composite distributed dielectric structure are normally routed perpendicularly to those of adjacent composite distributed dielectric structures.

The following example is taken from the second preferred embodiment shown in FIG. 3B.

Figure 8:
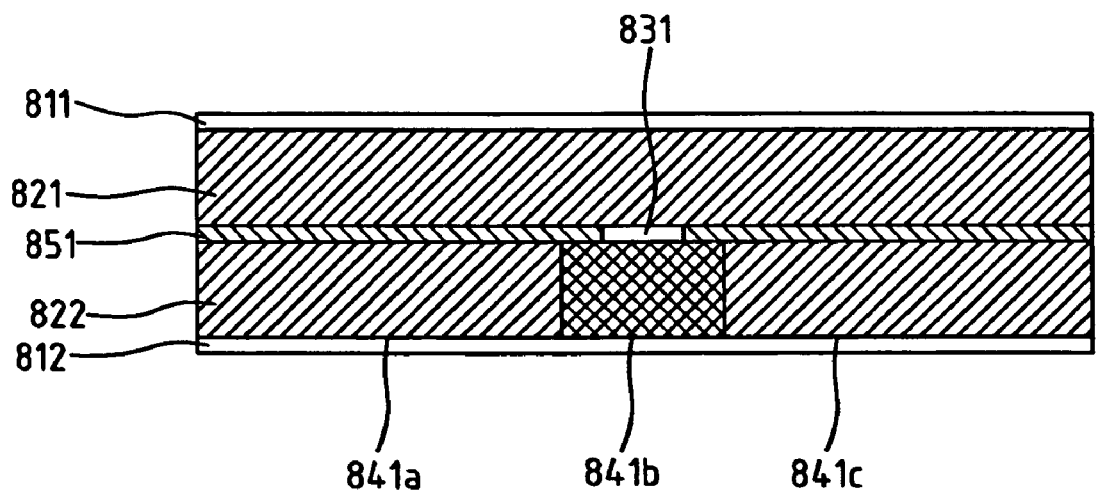
FIG. 8 is a side view of an example of FIG. 3B according to the present invention.

FIG. 8 is a side view of an example of FIG. 3B according to the present invention. Referring to FIG. 8, the composite distributed dielectric structure comprises two conductor layers 811-812, two dielectric layers 821-822, a conductor trace 831 formed on the dielectric layer 822, and a dielectric plate 851 formed around the conductor trace 832. The dielectric layer 822 has plural dielectric materials 841a-841c therein. The conductor trace 831 on the dielectric layer 822 does not cross two different dielectric materials.

Figure 9A:
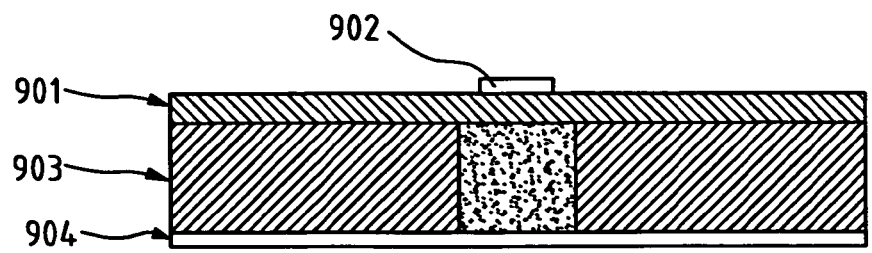
FIG. 9A is a side view illustrating an adhesive layer is further attached between a conductor trace and a dielectric layer.
Figure 9B:
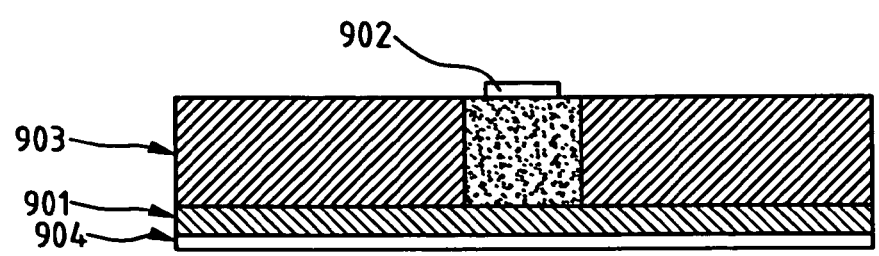
FIG. 9B is a side view illustrating an adhesive layer is further attached between a dielectric layer and a conductor layer.

According to the invention, an adhesive layer may be further attached between a conductor trace and a dielectric layer, or between a dielectric layer and a conductor layer. FIG. 9A illustrates an adhesive layer 901 is further attached between a conductor trace 902 and a dielectric layer 903. FIG. 9B illustrates an adhesive layer 901 is further attached between a dielectric layer 903 and a conductor layer 904.

Figure 10:
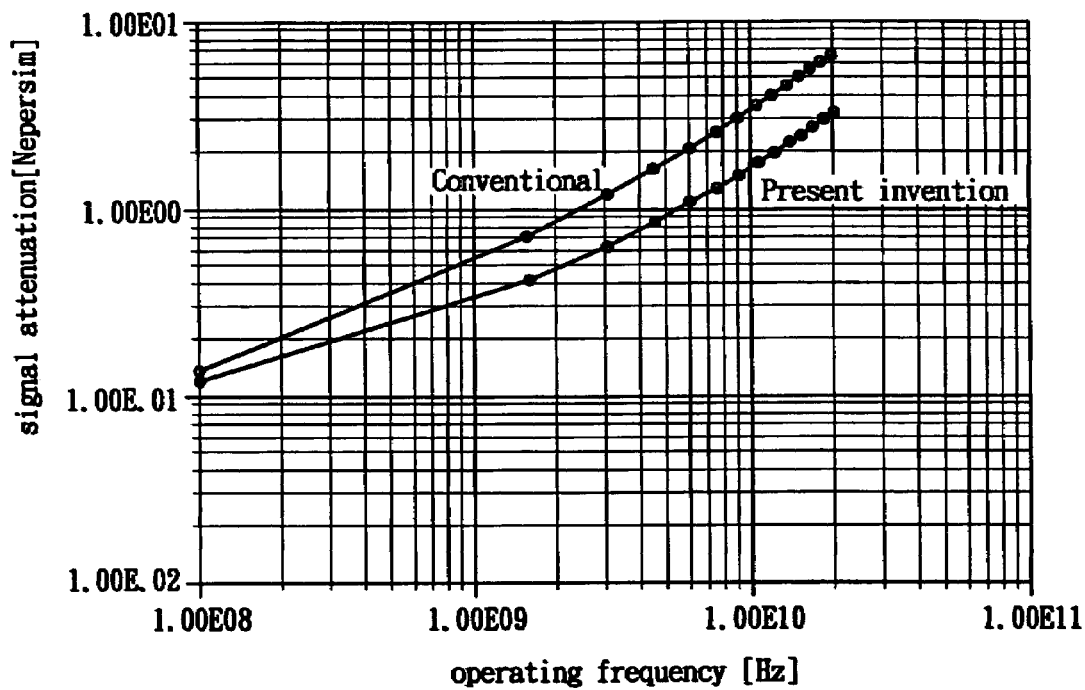
FIG. 10 shows the simulated signal attenuation in a conventional microstrip line and in a composite distributed dielectric structure according to the present invention, in which both low dielectric constant materials and conductors are therein.

FIG. 10 shows the simulated signal attenuation in a conventional microstrip line and in a composite distributed dielectric structure according to the present invention, in which both low dielectric constant materials and conductors are therein. The horizontal axis represents operating frequency, and the vertical axis represents signal attenuation. It can be clearly seen that the composite distributed dielectric structure of the present invention provides a lower dielectric loss than the conventional microstrip line. And, the differences between them increase with increasing frequency.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A composite distributed dielectric structure, comprising:
   one or more conductor layers;
   one or more dielectric layers distributed on said conductor layers, wherein at least one of said dielectric layers has plural sections formed with different dielectric materials therein; and
   one or more conductor traces distributed on said dielectric layers.

2. The composite distributed dielectric structure as claimed in claim 1, wherein the dielectric layer having plural sections formed with different dielectric materials therein has at least two dielectric constants.

3. The composite distributed dielectric structure as claimed in claim 1, wherein each conductor trace lies on a dielectric material without crossing two sections with different dielectric materials.

4. The composite distributed dielectric structure as claimed in claim 1, wherein an adhesive layer is further attached between a dielectric layer and a conductor layer.

5. The composite distributed dielectric structure as claimed in claim 1, wherein an adhesive layer is further attached between a conductor trace and a dielectric layer.

6. The composite distributed dielectric structure as claimed in claim 1, wherein said composite distributed dielectric structure is realized with a flexible laminate.

7. The composite distributed dielectric structure as claimed in claim 1, wherein said composite distributed dielectric structure is realized with a printed circuit board.

8. The composite distributed dielectric structure as claimed in claim 1, wherein said composite distributed dielectric structure is realized with a substrate.

9. The composite distributed dielectric structure as claimed in claim 1, wherein conductor traces lying on different dielectric layers are electrically connected through via holes.

10. The composite distributed dielectric structure as claimed in claim 1, wherein two or more dielectric layers are stacked on one conductor layer.

11. A composite distributed dielectric structure, comprising:
    a plurality of conductor layers;
    one or more dielectric layers distributed on each of said plurality of conductor layers with at least two adjacent conductor layers having at least two neighboring dielectric layers distributed between the two adjacent conductor layers; and
    one or more conductor traces distributed on said dielectric layers with at least one conductor trace distributed between two neighboring dielectric layers;
    wherein at least one of said conductor traces between two neighboring dielectric layers has one or more dielectric plates formed around the conductor trace and between the two neighboring dielectric layers.

12. The composite distributed dielectric structure in claimed 11, wherein at least one of said dielectric layers has plural sections formed with different dielectric materials therein.

13. The composite distributed dielectric structure in claimed 12, wherein the dielectric layer having plural sections formed with different dielectric materials therein has at least two dielectric constants.

14. The composite distributed dielectric structure in claimed 11, wherein at least one of said dielectric plates has plural sections formed with different dielectric materials therein.

15. The composite distributed dielectric structure in claimed 14, wherein the dielectric plate having plural sections formed with different dielectric materials therein has at least two dielectric constants.

16. The composite distributed dielectric structure as claimed in claim 11, wherein each conductor trace lies on a dielectric material without crossing two sections with different dielectric materials.

17. The composite distributed dielectric structure as claimed in claim 11, wherein an adhesive layer is further attached between a dielectric layer and a conductor layer.

18. The composite distributed dielectric structure as claimed in claim 11, wherein an adhesive layer is further attached between a conductor trace and a dielectric layer.

19. The composite distributed dielectric structure as claimed in claim 11, wherein said composite distributed dielectric structure is realized with a flexible laminate.

20. The composite distributed dielectric structure as claimed in claim 11, wherein said composite distributed dielectric structure is realized with a printed circuit board.

21. The composite distributed dielectric structure as claimed in claim 11, wherein said composite distributed dielectric structure is realized with a substrate.

22. The composite distributed dielectric structure as claimed in claim 11, wherein conductor traces lying on different dielectric layers are electrically connected through via holes.

23. The composite distributed dielectric structure as claimed in claim 11, wherein two or more dielectric layers are stacked on one conductor layer.

* * * * *